(12) United States Patent
Heliö et al.

(10) Patent No.: US 8,659,360 B2
(45) Date of Patent: Feb. 25, 2014

(54) CHARGE-TO-DIGITAL TIMER

(75) Inventors: Petri Heliö, Tampere (FI); Petri Korpi, Kangasala (FI); Niko Mikkola, Tampere (FI); Paavo Väänänen, Nokia (FI); Sami Vilhonen, Lieto (FI)

(73) Assignee: St-Ericsson SA, Plan-les-Ouates (CH)

( * ) Notice: Subject to any disclaimer, the term of this patent is extended or adjusted under 35 U.S.C. 154(b) by 45 days.

(21) Appl. No.: 13/338,390

(22) Filed: Dec. 28, 2011

(65) Prior Publication Data
US 2013/0169327 A1 Jul. 4, 2013

(51) Int. Cl.
*H03L 7/085* (2006.01)
*H03M 1/50* (2006.01)
*H03M 1/56* (2006.01)
*H03D 13/00* (2006.01)

(52) U.S. Cl.
USPC ............. 331/25; 331/1 A; 341/111; 341/166; 327/3

(58) Field of Classification Search
USPC .......... 331/25, 1 A, 44; 327/156, 157, 159, 1, 327/2, 3, 5, 7; 341/166, 111
See application file for complete search history.

(56) References Cited

U.S. PATENT DOCUMENTS

| 5,886,660 A * | 3/1999 | Loewenstein ............... 341/166 |
| 6,756,699 B2 | 6/2004 | Hartmann et al. |
| 6,850,102 B2 | 2/2005 | Hsu et al. |
| 6,870,411 B2 | 3/2005 | Shibahara et al. |
| 7,095,287 B2 | 8/2006 | Maxim et al. |
| 7,609,756 B2 | 10/2009 | Wood |
| 7,667,633 B2 * | 2/2010 | Choi et al. ............... 341/166 |
| 7,791,428 B2 * | 9/2010 | Chang et al. ............... 332/123 |
| 8,363,033 B2 | 1/2013 | Chen et al. |
| 2006/0017603 A1 | 1/2006 | Demirdag et al. |
| 2006/0121858 A1 | 6/2006 | Tanaka et al. |
| 2009/0072911 A1 | 3/2009 | Ke et al. |
| 2010/0238057 A1 * | 9/2010 | Wood ............... 341/124 |
| 2010/0244971 A1 | 9/2010 | Wang et al. |

FOREIGN PATENT DOCUMENTS

| DE | 3834938 C1 | 12/1989 |
| EP | 0662650 A2 | 7/1995 |
| EP | 2388923 A1 | 11/2011 |
| FR | 2224759 A1 | 10/1974 |
| WO | 2008088986 A2 | 7/2008 |

OTHER PUBLICATIONS

Hsu, C-M., et al., "A Low-Noise Wide-BW 3.6-GHz Digital ΔΣ Fractional-N Frequency Synthesizer With a Noise-Shaping Time-to-Digital Converter and Quantization Noise Cancellation", IEEE Journal of Solid-State Circuits, Dec. 1, 2008, pp. 2276-2786, vol. 43, No. 12, IEEE.

(Continued)

Primary Examiner — Ryan Johnson
(74) Attorney, Agent, or Firm — Coats & Bennett, P.L.L.C.

(57) ABSTRACT

The charge-to-digital timer apparatus and method disclosed herein estimates the elapsed time between two signals, e.g., a start signal and a stop signal. To that end, at least a capacitive load is charged with a known current to generate a load voltage. Subsequently, a first voltage is ramped in a plurality of discrete voltage steps associated with a plurality of known capacitances until the ramped voltage satisfies a predetermined criterion relative to a second voltage. The elapsed time is determined from the discrete voltage steps, one of the first and second voltages, the known current, and the known capacitive load.

27 Claims, 9 Drawing Sheets

(56) References Cited

OTHER PUBLICATIONS

Galton, I., "Analog-Input Digital Phase-Locked Loops for Precise Frequency and Phase Demodulation", IEEE Transactions on Circuits and Systems-II: Analog and Digital Signal Processing, Oct. 1, 1995, pp. 621-630, vol. 42, No. 10, IEEE.

Staszewski, R. B., et al., "All-Digital TX Frequency Synthesizer and Discrete-Time Receiver for Bluetooth Radio in 130-nm CMOS", IEEE Journal of Solid-State Circuits, Dec. 1, 2004, pp. 2278-2291, vol. 39, Issue 12, IEEE Solid-State Circuits Society.

Dawson, J. W., et al., "Fast TDC For On-line TOF Using Monolithic Flash A/D Converter", IEEE Transactions on Nuclear Science, Feb. 1, 1981, pp. 610-612, vol. NS-28, No. 1, IEEE.

Napolitano, P., et al., "A Novel Sample-and-Hold-Based Time-to-Digital Converter Architecture", IEEE Transactions on Instrumentation and Measurement, May 1, 2010, pp. 1019-1026, vol. 59, Issue 5, IEEE Instrumentation and Measurement Society.

Staszewski, R. B., et al., "Time-to-Digital Converter for RF Frequency Synthesis in 90 nm CMOS", Radio Frequency integrated Circuits (RFIC) Symposium, Digest of Papers, Dec. 6, 2005, pp. 473-476, IEEE.

\* cited by examiner

CHARGE-TO-DIGITAL TIMER

The invention described herein generally relates to time-to-digital converters that estimate a time difference between two signals, and more particularly relates to a charge-to-digital timer that estimates the time difference between the two signals.

BACKGROUND

Time-to-Digital Converters (TDCs) are used in many electronic circuits to estimate the time difference between two signals, e.g., a start signal and a stop signal, and to provide the time difference in digital form. One exemplary application for a TDC comprises a Radio Frequency (RF) circuit, where a TDC may be used to estimate the time difference between a reference signal and an oscillator signal in a Phase-Locked Loop (PLL) system. TDCs may also be used to detect light/photons in nuclear medical imaging, e.g., Positron Emission Tomography (PET), for Time-Of-Flight (TOF) measurements, e.g., in radiation detection and in laser radars, and in a variety of other space, nuclear, and measurement science applications.

Several types of TDCs exist in the literature. One type of TDC comprises a Charge-to-Digital Timer (CDT). The basic architecture for a conventional CDT comprises a current source, an integrator, and a flash analog-to-digital converter, such as disclosed in "Fast TDC for On-Line TOF Using Monolithic Flash A/D Converter," J. Dawson, D. Underwood, IEEE Transactions on Nuclear Science, vol. NS-28, no. 1, February 1981. At the time of the Dawson et al. paper, the CDT was implemented using discrete components and a separate flash analog-to-digital converter.

Another exemplary TDC comprises a Vernier Delay Line (VDL), which uses a Complementary Metal-Oxide Semiconductor (CMOS) buffer/inverter delay to estimate the time difference between the start and stop signals. By using tapped delay lines, the TDC may achieve resolutions smaller than those achievable with a single inverter delay. For example, a VDL may achieve ~20 ps resolution with a 65 nm CMOS process.

For cellular applications, target resolutions span from sub-picoseconds to tens of picoseconds. Even for the picosecond range resolution, the VDL solution requires some averaging or interpolation because the inverter speed and impedance mismatches limit the single-shot resolution to ~10 ps. Thus, VDL solutions do not provide sufficient resolution for many cellular applications.

Further the tapped delay line of a VDL solution generally consumes a lot of power, especially when the start and/or stop signals are associated with a high clock frequency. Conventional solutions directed at reducing the power consumption of a VDL may cause power regulation problems in integrated solutions, non-linearities in the conversion, and/or performance degradations. In addition, it is difficult to characterize and calibrate the tapped delay line used in a VDL.

Thus, there remains a need for improved TDCs.

SUMMARY

The charge-to-digital timer apparatus and method disclosed herein estimates the elapsed time between two signals, e.g., a start signal and a stop signal. To that end, the charge-to-digital timer apparatus and method charge a capacitive load with a known current to generate a load voltage based on the charged capacitive load. The charge-to-digital timer apparatus and method then ramp a first voltage in a plurality of discrete voltage steps until the ramping voltage satisfies a predetermined criterion relative to a second voltage. The charge-to-digital timer apparatus and method then determine the elapsed time from the discrete voltage steps, one of the first and second voltages, the known current, and the charged capacitive load.

One exemplary charge-to-digital timer comprises a charging unit, a voltage stepping unit, a comparator, and an estimation unit. The charging unit charges a capacitive load of the voltage stepping unit with a known current between the start and stop signals to generate a load voltage based on the charged capacitive load. The voltage stepping unit is operatively connected to the charging unit and ramps a first voltage from an initial value in a plurality of discrete voltage steps after the stop signal. The comparator is operatively connected to the charging unit and the voltage stepping unit and is configured to compare the ramping first voltage to a second voltage. The estimation unit is operatively connected to the voltage stepping unit and the comparator, and is configured to estimate the load voltage based on a combination of the discrete voltage steps when the ramping first voltage satisfies a predetermined condition relative to the second voltage, and to estimate the elapsed time between the start and stop signals from the estimated load voltage, the charged capacitive load, and the known current.

One exemplary method generates an initial reference voltage and charges a capacitive load with a known current between the start and stop signals to generate a load voltage based on the charged capacitive load. The method further ramps one of the load voltage and a reference voltage, in a plurality of discrete voltage steps after the stop signal, until a comparison between the load and reference voltages satisfies a predetermined criterion. When the comparison satisfies the predetermined criterion, the method estimates the initial load voltage based on the reference voltage and a combination of the discrete voltage steps. For example, when the reference voltage has a predetermined value greater than the load voltage, ramping one of the load voltage and the reference voltage comprises increasing the load voltage in the plurality of discrete voltage steps until the increasing load voltage equals or exceeds the reference voltage. For this example, the method estimates the initial load voltage based on a negative combination of the discrete voltage steps and the reference voltage. The method then estimates the elapsed time between the start and stop signals based on the estimated load voltage, the charged capacitive load, and the know current.

DETAILED DESCRIPTION

Figure 1:
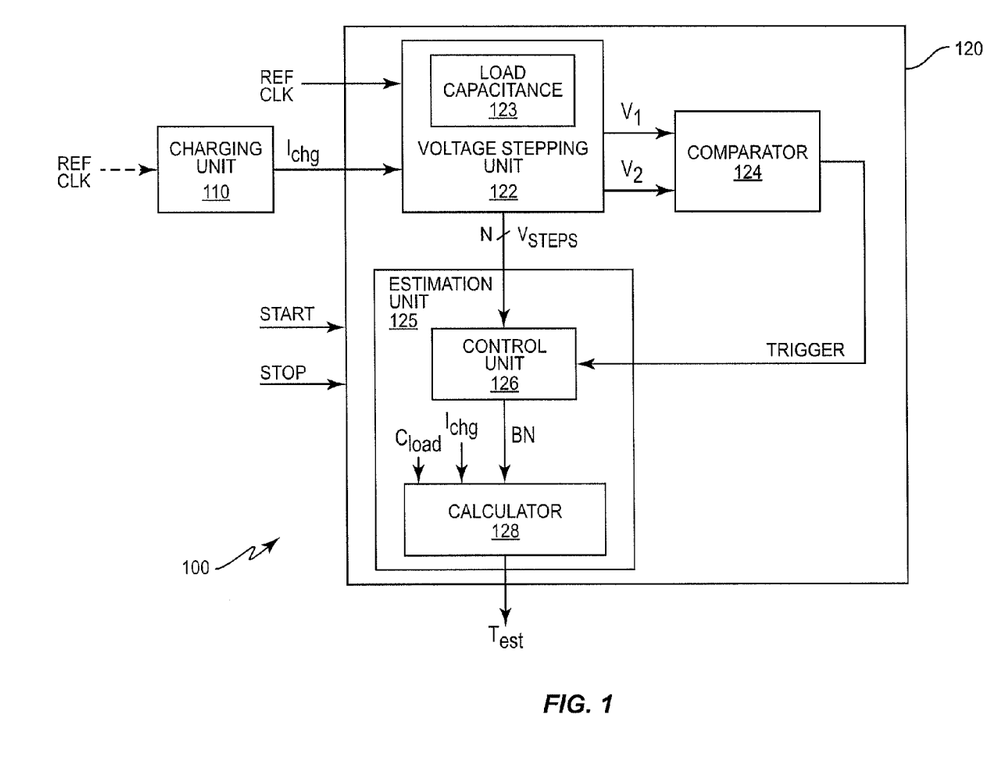
FIG. 1 depicts a block diagram of a Charge-to-Digital Timer (CDT) according to one exemplary embodiment.
Figure 2:
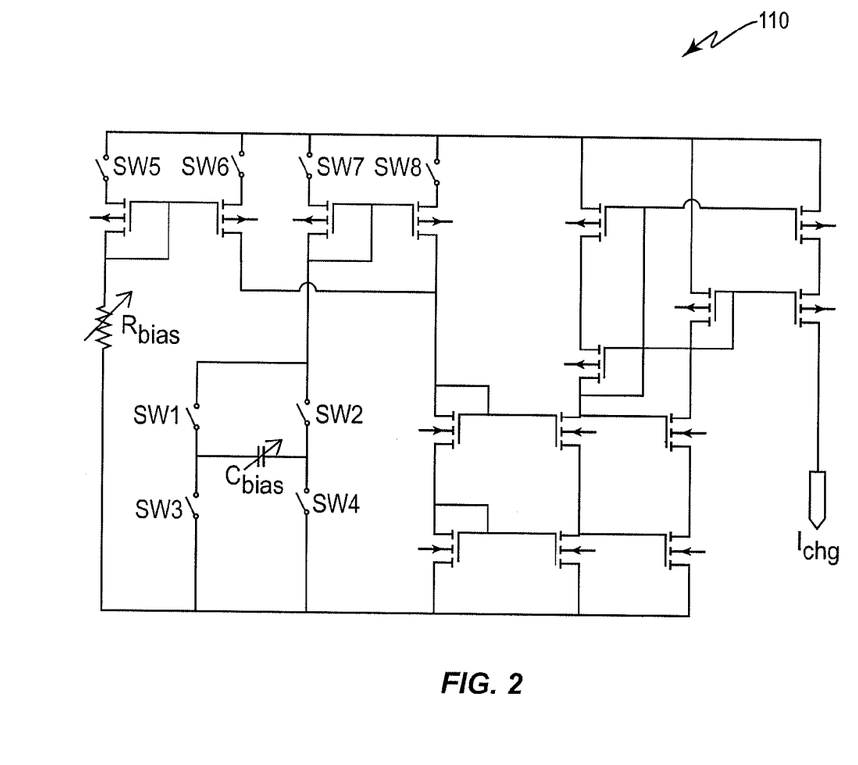
FIG. 2 depicts a circuit diagram for one exemplary charging unit of the CDT.

FIG. 1 depicts one exemplary charge-to-digital timer 100 comprising a charging unit 110 and a measurement unit 120. Charging unit 110 outputs a known current $I_{chg}$ to the measurement unit 120 during a charge phase defined as the time between the start signal and a stop signal. While not explicitly shown, it will be appreciated that $I_{chg}$ may be tunable. FIG. 2 depicts an exemplary transistor-based charging unit 110. The current source in FIG. 2 comprises a tunable current source capable of driving a steady current to a capacitive load of the measurement unit 120. This current source can generate the current using a tunable resistor $R_{bias}$ and/or using a tunable capacitor $C_{bias}$, where the tunable element is switched with four switches SW1-SW4, which are clocked by REF CLK, and where $C_{bias}$ generates a reference current using a typical switched capacitor circuit for approximating a resistor. The switching is done so that SW1 and SW4 are closed while SW2 and SW3 are opened and vice versa. Thus, REF_CLK provided to SW2 and SW3 is inverted from the REF_CLK driving SW1 and SW4 with the limitation that the clocks do not overlap so that all the switches are closed at the same time. These two bias current branches are powered up or down with switches SW5-SW8, depending on the desired bias mode, such that they are not active at the same time. Measurement unit 120 estimates the time between the start and stop signals during a measurement phase that begins after the stop signal, and outputs the estimated time $T_{est}$.

More particularly, measurement unit 120 comprises a voltage stepping unit 122, including a capacitive load 123, a comparator 124, and an estimation unit 125 comprising a control unit 126 and a calculator 128. Voltage stepping unit 122 outputs a ramping voltage $V_1$ and a fixed voltage $V_2$, where one of $V_1$ and $V_2$ is derived from a load voltage generated by the capacitive load 123 charged responsive to the charging current $I_{chg}$, and where the voltage stepping unit 122 ramps $V_1$ in a plurality of discrete voltage steps. Each discrete voltage step used to ramp $V_1$ is also output to the control unit 126. Comparator 124 outputs a trigger to the estimation unit 125 when a comparison between $V_1$ and $V_2$ satisfies a predetermined criterion. Responsive to the trigger, estimation unit 125 estimates the load voltage $V_{load,est}$ based on $V_2$ and a combination of the discrete voltage steps associated with the voltage stepping unit 122, and then estimates the time $T_{est}$ between the start and stop signals based on $V_{load,est}$, $I_{chg}$, and the charged capacitive load. More particularly, control unit 126 samples the state of the buffer line associated with the voltage steps (see FIGS. 5 and 7), and outputs an index (BN) to the calculator 128 representative of the combination of the discrete voltage steps. Calculator 128 then estimates the load voltage based on BN and estimates the elapsed time from the estimated load voltage, the charged capacitive load, and the known current.

Figure 3:
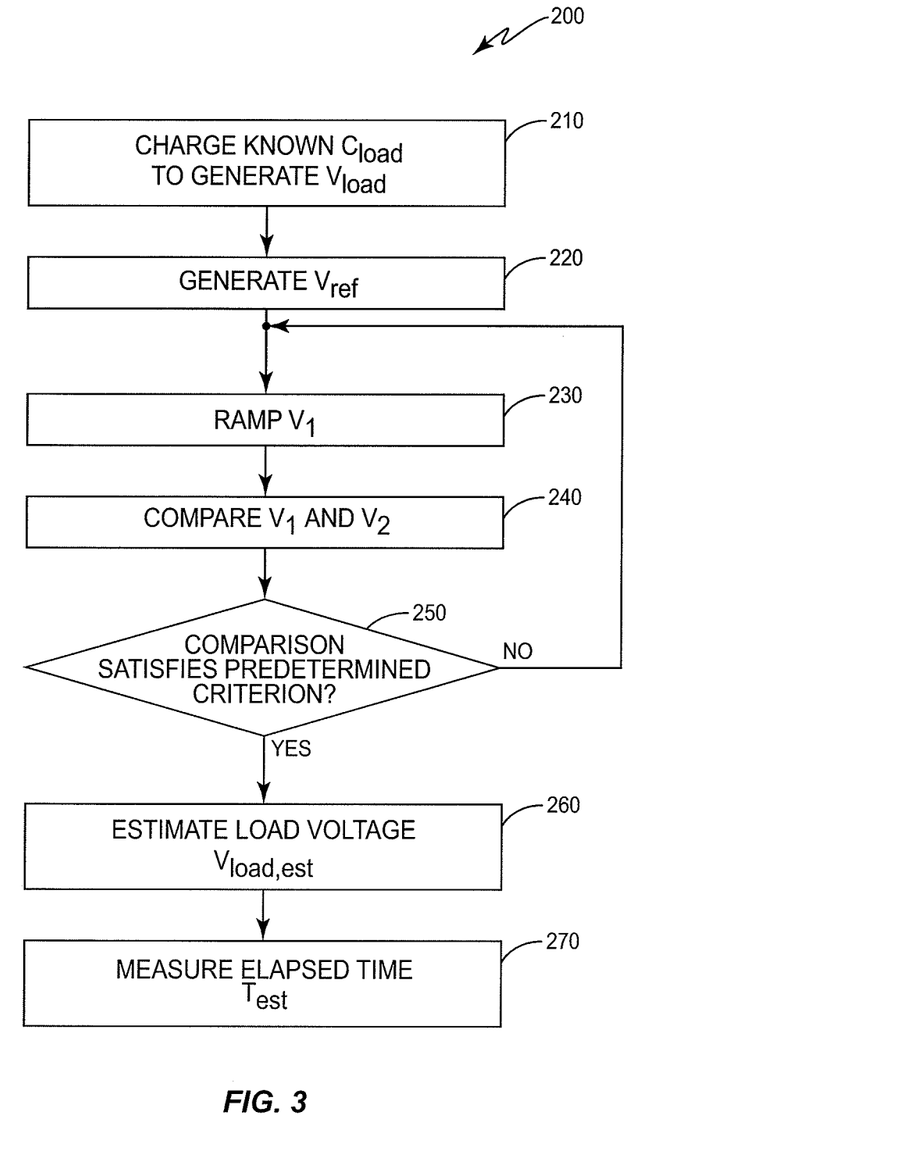
FIG. 3 depicts a process diagram for estimating the elapsed time between start and stop signals using the CDT of FIG. 1.

FIG. 3 depicts one exemplary method 200 executed by the charge-to-digital timer 100. Charging unit 110 charges the capacitive load 123 in the voltage stepping unit 122 with charge current $I_{chg}$ during the charge phase to generate a load voltage $V_{load}$ based on the charged capacitive load 123 (block 210). In addition to generating the load voltage responsive to $I_{chg}$, voltage stepping unit 122 also generates a reference voltage $V_{ref}$ (block 220). As discussed further below, one of $V_{load}$ and $V_{ref}$ corresponds to the voltage $V_1$ ramped by the voltage stepping unit 122, while the other of $V_{load}$ and $V_{ref}$ corresponds to the fixed voltage $V_2$. The voltage stepping unit 122 ramps $V_1$ (block 230) in a plurality of discrete voltage steps as comparator 124 compares the ramping voltage $V_1$ to the fixed voltage $V_2$ (block 240). If the comparison does not satisfy a predetermined criterion (block 250), the voltage stepping unit 122 continues to ramp $V_1$. When the comparison satisfies the predetermined criterion (block 250), the estimation unit 125 estimates the load voltage $V_{load,est}$ (block 260) and then estimates the elapsed time $T_{est}$ between the start and stop signals (block 270).

The following provides several exemplary embodiments for the voltage stepping unit 122, comparator 124, and estimation unit 125. It will be appreciated that these exemplary embodiments are for illustration purposes only and do not limit the charge-to-digital timer apparatus and method claimed herein.

Figure 4:
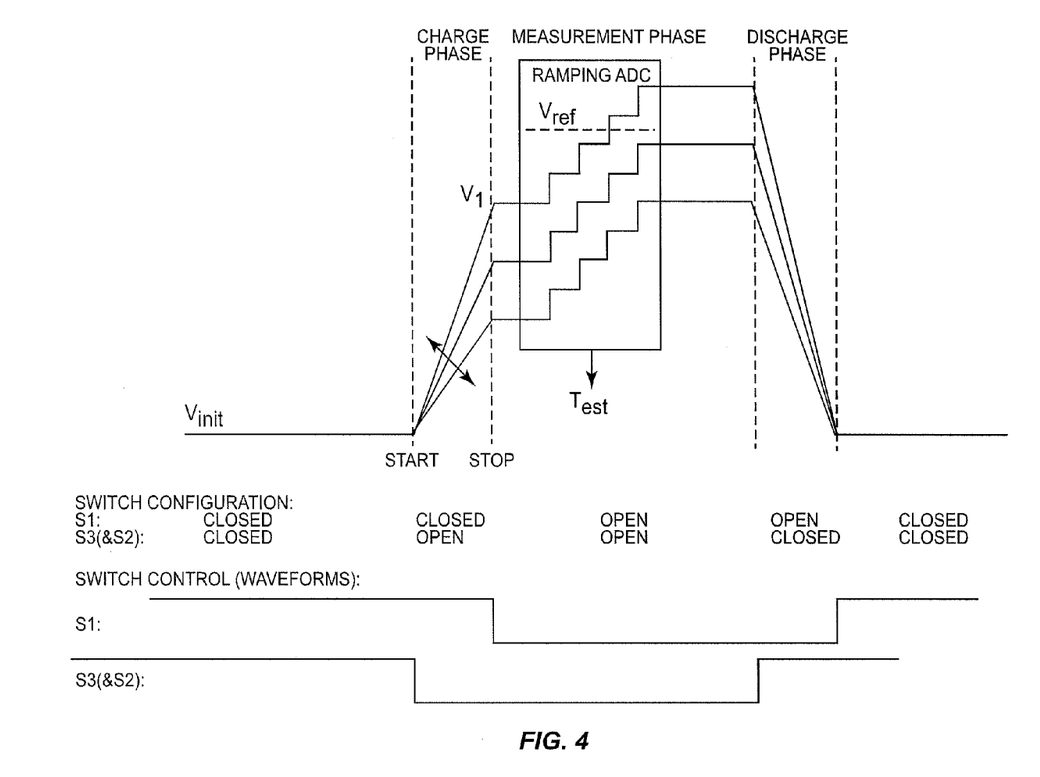
FIG. 4 depicts the voltage during one exemplary estimation process using one exemplary CDT, e.g., the CDT of FIG. 5.

In one exemplary embodiment, $V_1$ initially comprises the load voltage $V_{load}$ at the end of the charge phase and $V_2$ comprises a reference voltage having a predetermined value, where the initial value of $V_1 < V_2$. FIG. 4 depicts the changes to the capacitor load voltage during the charge and measurement phases. Before the start signal is applied to the measurement unit 120 to allow $I_{chg}$ from the charging unit 110 to charge the capacitive load 123, the load voltage of the capacitive load 123 is set to an initial value $V_{init}$, which is 0 V in some embodiments (e.g., FIG. 5), but may comprise any predetermined voltage value (e.g., $V_{pwr}$ in FIG. 7). During the charge phase, $V_{init}$ increases during the time between the start and stop signals based on $I_{chg}$ and the capacitance $C_{load}$ of the capacitive load 123 of the voltage stepping unit 122, as described further herein. As shown in FIG. 4, the values of $I_{chg}$ and $C_{load}$ dictate the slope of the voltage increase during the charge phase. Voltage $V_1$ is set equal to the load voltage $V_{load}$ at the completion of the charge phase.

After the stop signal is applied to the measurement unit 120 to stop $I_{chg}$ from further charging the capacitive load, the measurement (MSMT) phase begins. In this embodiment, the voltage stepping unit 122 increases $V_1 = V_{load}$ in discrete voltage steps. While the voltage steps depicted in FIG. 4 comprise equally sized voltage steps, it will be appreciated that unequal voltage steps may also be used. Once $V_1$ equals or exceeds the reference voltage $V_2 = V_{ref}$, comparator 124 outputs the trigger, estimation unit 125 estimates the load voltage $V_{load,est}$ at the end of the charge phase based on a negative combination of the discrete voltage steps represented by BN and $V_2 = V_{ref}$, and estimates the elapsed time $T_{est}$ between the start and stop signals based on $V_{load,est}$, $I_{chg}$, and the charged capacitive load 123. Subsequently, the voltage stepping unit 122 may enter a discharge phase to discharge the capacitive load 123 and/or other capacitors in the voltage stepping unit 122. It will be appreciated that the voltage stepping unit 122 may alternately enter the discharge phase after comparator 124 outputs the trigger.

In another exemplary embodiment, $V_1 = V_{load}$ at the end of the charge phase and $V_2 = V_{ref}$ having a predetermined value, where the initial value of $V_1 > V_2$. As with the previous embodiment, the charging unit 110 increases the load voltage from an initial value $V_{init}$ during the time between the start and stop signals during the charge phase to generate $V_1 = V_{load}$ based on the charged capacitive load.

After the stop signal is applied to the measurement unit 120 to stop $I_{chg}$ from further charging the capacitive load 123, the measurement phase begins. In this embodiment, the voltage stepping unit 122 ramps $V_1$ by decreasing $V_1 = V_{load}$ in discrete voltage steps, where the voltage steps may comprise equal or unequal voltage steps. Once $V_1$ is less than or equal to $V_2 = V_{ref}$, comparator 124 outputs the trigger, estimation unit 125 estimates the load voltage $V_{load,est}$ at the end of the charge phase based on a positive combination of the discrete voltage steps represented by BN and $V_{ref}$, and estimates the elapsed time $T_{est}$ between the start and stop signals based on $V_{load,est}$, $I_{chg}$, and the charged capacitive load 123. Subsequently, the voltage stepping unit 122 may enter a discharge phase to discharge the capacitive load 123 and/or any other capacitors in the voltage stepping unit 122. It will be appreciated that the voltage stepping unit 122 may alternately enter the discharge phase after comparator 124 outputs the trigger.

In yet another exemplary embodiment, $V_2=V_{load}$ and $V_1$ comprises a reference voltage $V_{ref}$ having a predetermined initial value, where the initial value of $V_1 < V_2$. In this embodiment, the predetermined initial value of the reference voltage may be, e.g., 0 V. After the stop signal is applied to the measurement unit 120 to stop $I_{chg}$ from further charging the capacitive load 123, the measurement phase begins. In this embodiment, the voltage stepping unit 122 ramps $V_1$ by increasing $V_1 = V_{ref}$ in discrete voltage steps, where the voltage steps may comprise equal or unequal voltage steps. Once $V_1$ equals or exceeds $V_2$, comparator 124 outputs the trigger, estimation unit 125 estimates the load voltage $V_{load,est}$ at the end of the charge phase based on a positive combination of the discrete voltage steps represented by BN and the initial value for $V_1 = V_{ref}$, and estimates the elapsed time $T_{est}$ between the start and stop signals based on $V_{load,est}$, $I_{chg}$, and the charge capacitive load 123. Subsequently, the voltage stepping unit 122 may enter a discharge phase to discharge the capacitive load 123 and/or any other capacitors in the voltage stepping unit 122. It will be appreciated that the voltage stepping unit 122 may alternately enter the discharge phase after comparator 124 outputs the trigger.

In another exemplary embodiment, $V_2=V_{load}$ and $V_1$ comprises a reference voltage having a predetermined initial value, where the initial value of $V_1 > V_2$. After the stop signal is applied to the measurement unit 120 to stop $I_{chg}$ from further charging the capacitive load 123, the measurement phase begins. In this embodiment, the voltage stepping unit 122 ramps $V_1$ by decreasing $V_1=V_{ref}$ in discrete voltage steps, where the voltage steps may comprise equal or unequal voltage steps. Once $V_1$ is less than or equal to $V_2$, comparator 124 outputs the trigger, estimation unit 125 estimates the load voltage $V_{load,est}$ at the end of the charge phase based on a negative combination of the discrete voltage steps represented by BN and the initial value for $V_1 = V_{ref}$, and estimates the elapsed time $T_{est}$ between the start and stop signals based on $V_{load,est}$, $I_{chg}$, and the charged capacitive load 123. Subsequently, the voltage stepping unit 122 may enter a discharge phase to discharge the capacitive load 123 and/or any other capacitors in the voltage stepping unit. It will be appreciated that the voltage stepping unit 122 may alternately enter the discharge phase after comparator 124 outputs the trigger.

Figure 5:
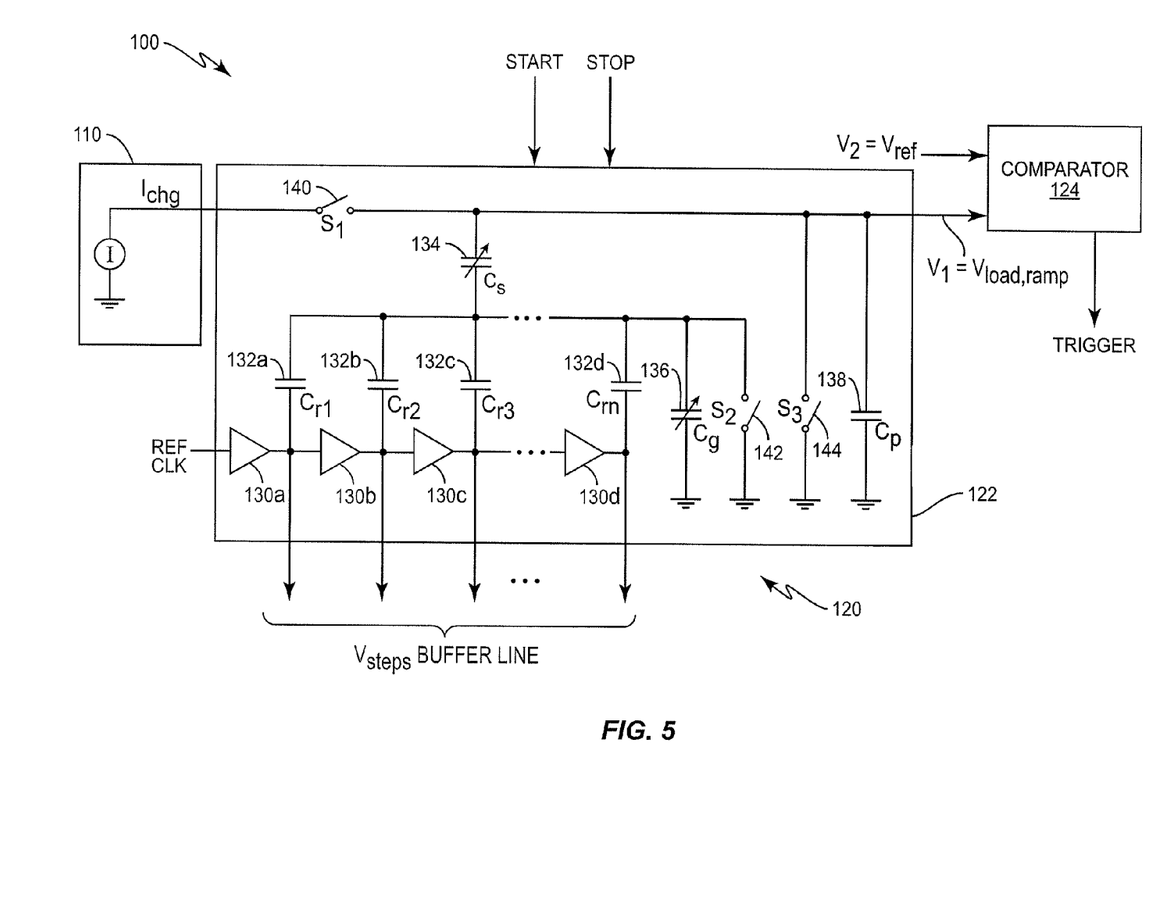
FIG. 5 depicts a circuit diagram for a CDT according to one exemplary embodiment.
Figure 7:
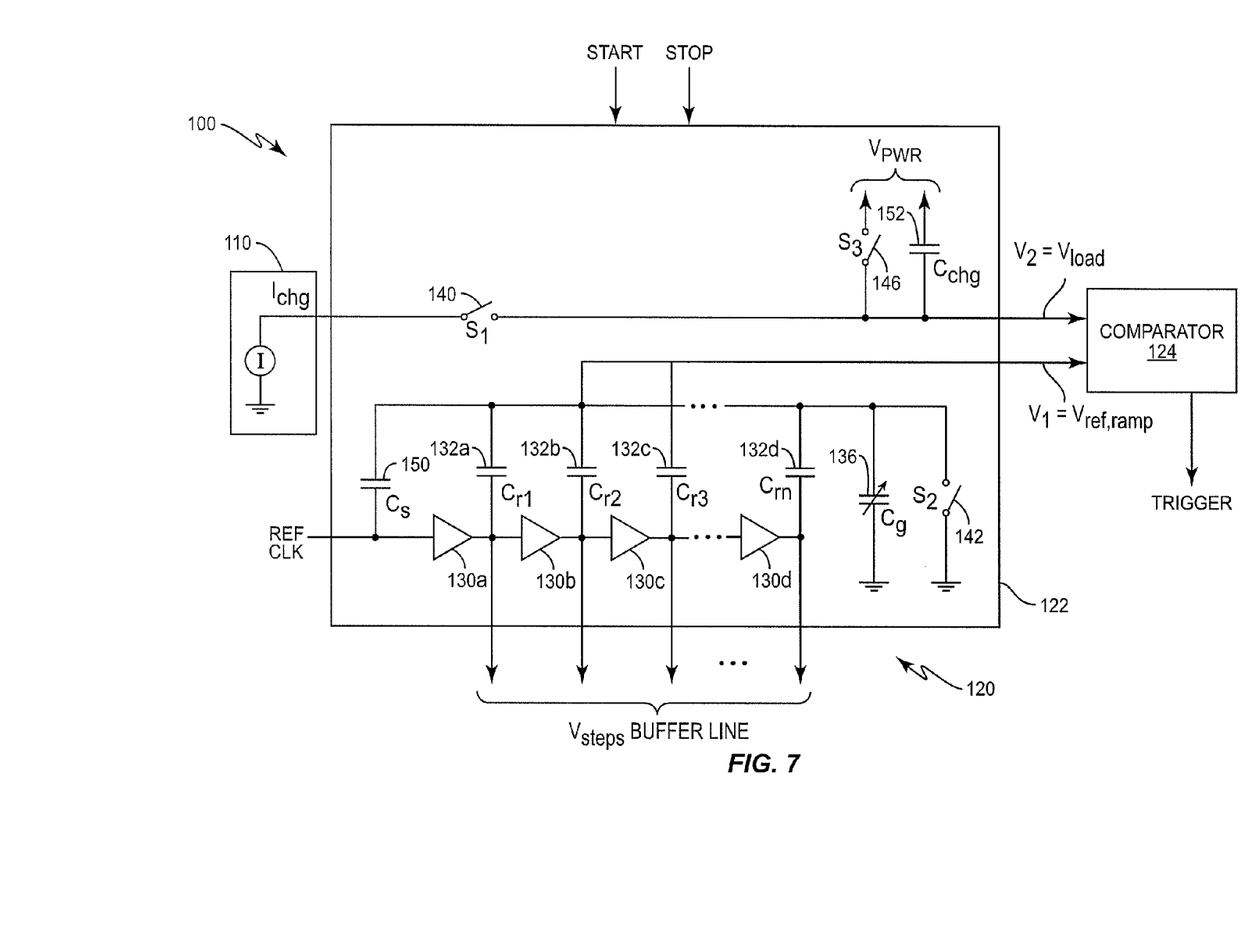
FIG. 7 depicts a circuit diagram for a CDT according to another exemplary embodiment.

FIGS. 5 and 7 depict exemplary charge-to-digital timers 100. Both comprise the charging unit 110 that comprises a current source to generate the charge current $I_{chg}$. Further, both comprise a voltage stepping unit 122 that receives $I_{chg}$ during the charge phase and outputs $V_1$ and $V_2$ during the measurement phase to the comparator 124. The differences between FIGS. 5 and 7 lie in the configuration of the voltage stepping unit 122. Thus, the following focuses on the specific implementations of the voltage stepping units 122 for the different embodiments.

The voltage stepping unit 122 of FIG. 5 sets $V_1$ equal to $V_{load}$ and step-wise ramps $V_{load}$ for comparison relative to a fixed reference voltage $V_2 = V_{ref}$. In this embodiment, a first input of comparator 124 receives $V_2$ from an external source, e.g., an external controller, and a second input of the comparator 124 receives $V_1$ from the voltage stepping unit 122.

In FIG. 5, the voltage stepping unit 122 comprises a plurality of serially connected buffers 130, a first switch $S_1$ 140, a second switch $S_2$ 142, a third switch $S_3$ 144, a variable scale capacitor $C_s$ 134, a variable gain capacitor $C_g$ 136, a parasitic capacitance $C_p$ 138, and a plurality of ramp capacitors $C_r$ 132, where the charging unit 110 charges $C_p$, $C_s$, $C_g$, and the ramp capacitors during the charge phase to generate the charged capacitive load 123. Scale capacitor $C_s$ 134 operatively connects at a first node to the output of the charging unit 110 and the second input of the comparator 124, and at a second node to a common node of the ramp capacitors 132. Gain capacitor $C_g$ 136 connects between the second node of $C_s$ 134 and ground, while the parasitic capacitance 138 is modeled as being connected between the second input of the comparator 124 and ground. The buffers 130 couple to the ramp capacitors 132 of the capacitive load 123, where each buffer 130 is configured to delay a reference clock by a predetermined delay, and where the voltage stepping unit 122 ramps $V_1 = V_{load}$ responsive to the delayed reference clock sequentially output by the buffers 130. More specifically, each buffer 130 comprises a digital buffer that functionally implements a switching function to switch the buffer output from a first fixed voltage, e.g., 0 V, to second fixed voltage, e.g., $V_{dd}$, during the ramping of the measurement phase when the reference clock passes through the buffer chain. As such, a charge is injected into the capacitive network formed by the N ramp capacitors $C_r$ 132 and the gain capacitor $C_g$ 136 as the reference clock passes through the buffer chain, where the step height of each voltage step depends on $V_{dd}$ and the capacitance ratio $C_{ri}/C_{tot}$, where $C_{tot}$ represents the total capacitance seen from the comparator input to ground, i represents the buffer stage, and $C_{ri}$ represents the unit capacitance for the $i^{th}$ buffer stage, and where $C_{tot}$ may be defined according to:

$$C_{tot} = NC_{ri} + C_g + \frac{C_s C_p}{C_s + C_p}. \qquad (1)$$

For example, when buffer 130c (buffer stage i=3) drives charge through $C_{r3}$ to the capacitive network having a total capacitance of $C_{tot}$, the total capacitance $C_{tot}$ in this case is formed by $C_g$ in parallel with the series connection of $C_s$ and $C_p$ and in parallel with $C_{r1}$, $C_{r2}$, and $C_{r3}$. In this case, the voltage step depends on $V_{dd}$ and $C_{r3}/C_{tot}$.

The first switch $S_1$ 140 connects between the output of the charging unit 110 and the first node of $C_s$ 134. The second switch $S_2$ 142 connects in parallel with $C_g$ 136, and the third switch $S_3$ 144 connects in parallel with $C_p$ 138. During the charge phase, $S_1$ 140 is actuated to a closed position while $S_2$ and $S_3$ 142, 144 are maintained in an open position to enable the capacitive load 123, e.g., $C_s$, $C_g$, $C_p$, and the $C_r$'s, to charge responsive to $I_{chg}$, where the charged capacitive load 123 may be defined by:

$$C_{chg} = C_p + \left( \frac{1}{C_s} + \frac{1}{C_g + NC_{ri}} \right)^{-1}. \qquad (2)$$

During the measurement phase, $S_1$ 140 is actuated to the open position to disconnect the charge unit 110 from the voltage stepping unit 122, while $S_2$ and $S_3$ 142, 144 remain in the open position. During a discharge phase, which occurs after comparator 124 outputs the trigger or charge-to-digital timer 100 outputs $T_{est}$, $S_1$ 140 remains in the open position, while $S_2$ and $S_3$ 142, 144 are actuated to the closed position to enable the capacitive load 123 to discharge to ground.

Figure 6:
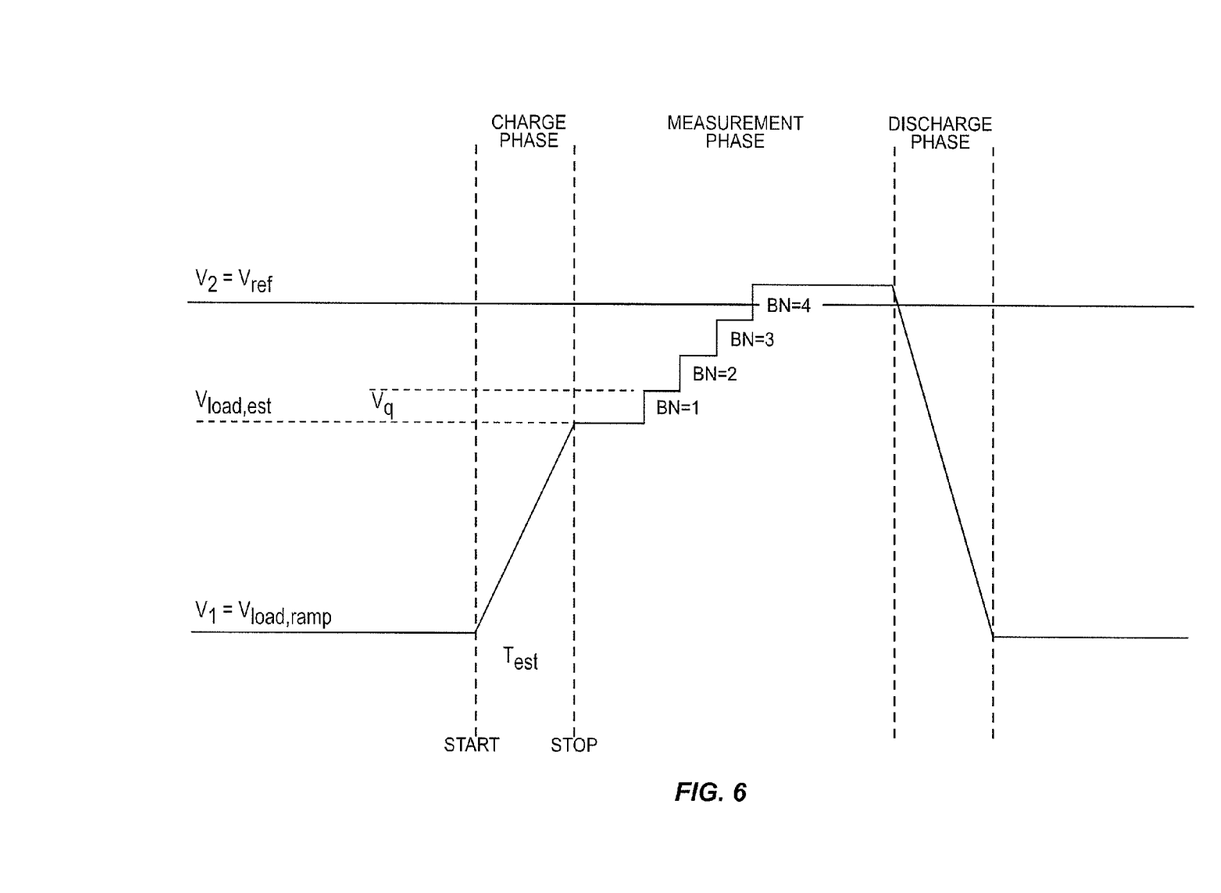
FIG. 6 depicts the various signals associated with the elapsed time estimation process using the CDT of FIG. 5.

Each ramp capacitor $C_r$ 132 connects between the second node of $C_s$ 134 at a common node and an output of a corresponding one of the buffers 130. During the measurement phase, the delayed reference clock applied by one of the buffers 130 to the corresponding ramp capacitor $C_r$ 132 ramps $V_1 = V_{load}$ by an amount determined by the corresponding ramp capacitor $C_r$ 132. For example, after the first buffer 130a applies a first delay to the reference clock, the initial value of $V_{load}$ ramps, e.g., increases, by a first voltage step corresponding to the charge accumulated in the first ramp capacitor $C_{r1}$ 132a, and the voltage stepping unit 122 sets the first buffer line associated with the first voltage step. If the comparison between the ramped $V_{load}$ voltage ($V_1 = V_{load,ramp}$) and $V_2 = V_{ref}$ does not satisfy the predetermined condition, e.g., $V_1 \geq V_2$, the ramping process continues such that, after the second buffer 130b applies a second delay to the delayed clock signal output by the first buffer 130a, the load voltage further ramps by a second voltage step corresponding to the charge accumulated in the second ramp capacitor $C_{r2}$ 132b, and the voltage stepping unit 122 sets the second buffer line associated with the second voltage step. Such ramping of the load voltage continues until the comparison between the ramping load voltage and the fixed reference voltage in the comparator 124 satisfies the predetermined condition. FIG. 6 depicts an exemplary signal diagram for one implementation of the embodiment of FIG. 5 for each of the charge, measurement, and discharge phases, where $V_q$ represents a voltage step size. While FIG. 6 shows that $V_2 > V_1$ before the charge phase begins, it will be appreciated that the initial pre-charge values for $V_1$ and $V_2$ may be any desired values, including $V_2 < V_1$ and $V_2 = V_1$. The elapsed time may subsequently be estimated according to:

$$T_{est} = V_{load,est} \frac{C_{chg}}{I_{chg}}. \tag{3}$$

For the embodiment of FIG. 5, $V_{load,est}$ may be acquired for one exemplary embodiment according to:

$$V_{load,est} = V_{ref} - BN \frac{C_{ri}}{C_{tot}} V_{dd} \tag{4}$$

where the combination of discrete voltage steps that caused the comparator 124 to trigger may be represented by a bin number BN, which represents the index of the buffer line provided by the control unit 126 responsive to the trigger output by the comparator 124, where the buffer line indicates the voltage steps output by voltage stepping unit 122, $V_{dd}$ represents the positive supply voltage (not shown) for each buffer cell 130 (it is assumed the negative supply voltage for each buffer cell 130 is tied to ground), $V_{load,est}$ represents the estimated load voltage at the end of the measurement phase, and the ratio of the accumulated charge to the total charge $C_{ri}/C_{tot}$. It will be appreciated that the accuracy of the $C_{ri}/C_{tot}$ ratio directly drives the accuracy of the elapsed time estimate.

Contrastingly to the embodiment of FIG. 5, where $V_1 = V_{load}$ and $V_2 = V_{ref}$, the voltage stepping unit 122 of FIG. 7 step-wise ramps $V_1 = V_{ref}$ for comparison relative to $V_2 = V_{load}$. In this embodiment, the voltage stepping unit 122 provides both $V_1$ and $V_2$ to respective first and second inputs of the comparator 124.

The voltage stepping unit 122 comprises a plurality of serially connected buffers 130, a first switch $S_1$ 140, a second switch $S_2$ 142, a third switch $S_3$ 146, a variable gain capacitor $C_g$ 136, a charge capacitor $C_{chg}$ 152, a plurality of ramp capacitors $C_r$ 132, and a scale capacitor $C_s$ 150. In this case, the charging unit 110 charges only $C_{chg}$, which represents the capacitive load 123 in this embodiment, during the charge phase. The voltage over the capacitive load 123 still changes during the charge phase responsive to $I_{chg}$. Scale capacitor $C_s$ 150 operatively connects between a common node of the N ramp capacitors $C_r$ 132 and an input to the buffers 130. Gain capacitor $C_g$ 136 connects between the second input of the comparator 124 and ground, while $C_{chg}$ 152 connects between the first input of the comparator 124 and a power supply. While not explicitly shown, it will be appreciated that $C_{chg}$ may be tunable. The buffers 130 couple to the ramp capacitors 132, where each buffer 130 is configured to delay a reference clock by a predetermined delay, and where the voltage stepping unit 122 ramps $V_1 = V_{ref}$ responsive to the delayed reference clock sequentially output by the buffers 130. More specifically, each buffer 130 comprises a digital buffer that functionally implements a switching function to switch the buffer output from a first fixed voltage, e.g., 0 V, to a second fixed voltage, e.g., $V_{dd}$, during the ramping of the measurement phase when the reference clock passes through the buffer chain. As such, a charge is injected into the capacitive network formed by the ramp capacitors $C_r$ 132 and the gain capacitor $C_g$ 136 as the reference clock passes through the buffer chain, where the step height of each voltage step depends on $V_{dd}$ and the capacitance ratio $C_{ri}/C_{tot}$, where $C_{tot}$ represents the total capacitance seen from the comparator input to ground, i represents the buffer stage, and $C_{ri}$ represents the unit capacitance for the $i^{th}$ buffer stage, and where $C_{tot}$ may be determined according to:

$$C_{tot} = NC_{ri} + C_g. \tag{5}$$

In the embodiment of FIG. 7, for example, the voltage stepping unit 122 ramps $V_1 = V_{ref}$ down during the measurement phase.

First switch $S_1$ 140 connects between the output of the charging unit 110 and the first input of the comparator 124, while second switch $S_2$ 142 connects in parallel with $C_g$ 136 and third switch $S_3$ 144 connects in parallel with $C_{chg}$ 152. During the charge phase, $S_1$ 140 is actuated to a closed position while $S_2$ and $S_3$ 142, 144 are maintained in an open position. During the measurement phase, $S_1$ 140 is opened to disconnect the charge unit 110 from the voltage stepping unit 122, while $S_2$ and $S_3$ 142, 144 remain in the open position. During a discharge phase, which occurs after comparator 124 outputs the trigger or charge-to-digital timer 100 outputs $T_{est}$ $S_1$ 140 is opened, while $S_2$ and $S_3$ 142, 144 are actuated to the closed position to enable the capacitive load 123, e.g., $C_{chg}$, and the remaining capacitors in the voltage stepping unit 122 to discharge.

Figure 8:
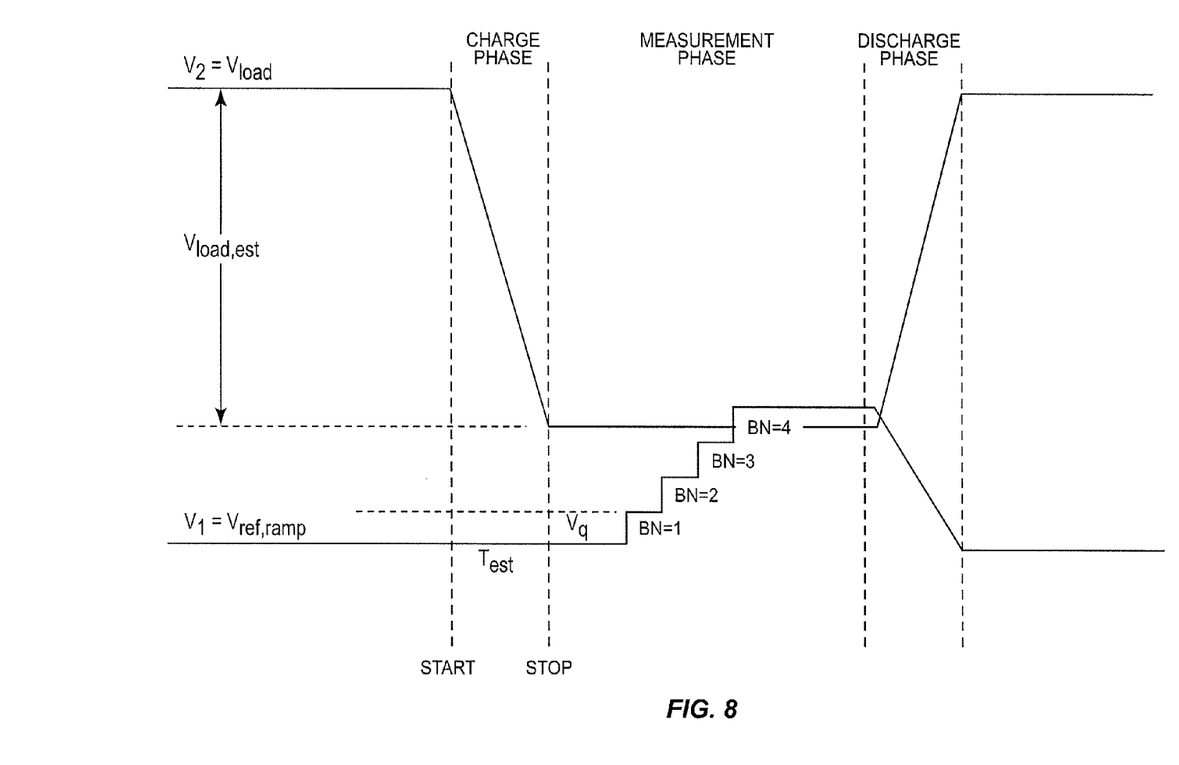
FIG. 8 depicts the various signals associated with the elapsed time estimation process using the CDT of FIG. 7.

Each of the ramp capacitors $C_r$ 132 connect between the second input of the comparator 124 at a common node and an output of a corresponding one of the buffers 130. During the measurement phase, the delayed reference clock applied by one of the buffers 130 to the corresponding ramp capacitor $C_r$ 132 ramps $V_1 = V_{ref}$ by an amount determined by the corresponding ramp capacitor $C_r$ 132. For example, after the first buffer 130a applies a first delay to the reference clock, the initial value of $V_{ref}$ ramps, e.g., increases, by a first voltage step corresponding to the charge accumulated in the first ramp capacitor $C_{r1}$ 132a, and the voltage stepping unit 122 sets the first buffer line associated with the first voltage step. If the comparison between the ramped $V_1 = V_{ref}$ and $V_2 = V_{load}$ does not satisfy the predetermined condition, e.g., $V_1 \geq V_2$, the ramping process continues such that, after the second buffer 130b applies a second delay to the delayed clock signal output by the first buffer 130a, the reference voltage further ramps by a second voltage step corresponding to the charge accumulated in the second ramp capacitor $C_{r2}$ 132b, and the voltage stepping unit 122 sets the second buffer line associated with the second voltage step. Such ramping of the reference voltage continues until the comparison between the ramping reference voltage and the fixed load voltage in the comparator 124 satisfies the predetermined condition. FIG. 8 depicts an exemplary signal diagram for one implementation of the embodiment of FIG. 7 for each of the charge, measurement, and discharge phases. While FIG. 8 shows that $V_2 > V_1$ before the charge phase begins, it will be appreciated that the initial pre-charge values for $V_1$ and $V_2$ may be any desired values, including $V_2 < V_1$ and $V_2 = V_1$. The elapsed time may be estimated according to Equation (3). For one example applicable to the embodiment of FIG. 7, $V_{load,est}$ may be acquired according to:

$$V_{load,est} = V_{pwr} - BN \frac{C_{ri}}{C_{tot}} V_{dd}, \qquad (6)$$

where for this example $V_2 = V_{pwr}$, $V_1 = V_{ref} = 0$, and $V_{dd}$ represents the positive supply voltage (not shown) for each buffer cell 130 (it is assumed the negative supply voltage for each buffer cell 130 is tied to ground). It will be appreciated that the accuracy of the $C_{ri}/C_{tot}$ ratio directly drives the accuracy of the elapsed time estimate.

For both the FIG. 5 and FIG. 7 embodiments, the achievable resolution lies between 4 ps and 8 ps when the time window for measurement is 200 ps and 400 ps, respectively when there are 50 ramp capacitors. The achievable resolution depends on the number of ramp capacitors $C_r$ 132 and the ratio of the combined ramp capacitance to the remaining capacitance of the capacitive load 123. In general, the values of the variable capacitors may be controlled during a calibration phase to obtain the desired resolution. For example, $C_g$ 136 and $C_s$ 134 may be varied during calibration to control the resolution of the variable stepping unit 122 of FIG. 5, while $C_g$ 136 and $C_{chg}$ 152 may be varied during calibration to control the resolution of the voltage stepping unit 122 of FIG. 7. In both cases, $C_g$ 136 has a stronger influence on the overall resolution of the charge-to-digital timer 100. In addition, the values selected for the variable capacitors during calibration affect the slope of the increasing load voltage during the charge phase. For example, the slope may be more steep as shown by the top line during the charge phase of FIG. 4, or may be less steep as shown by the bottom line during the charge phase of FIG. 4. In this case, $C_s$ 134 has the strongest influence on the charge phase slope for the embodiment of FIG. 5, while $C_{chg}$ 152 has the strongest influence on the charge phase slope for the embodiment of FIG. 7.

While FIGS. 1, 5, and 7 show the start and stop signals as being applied to the measurement unit 120, it will be appreciated that the start and stop signals may alternatively be applied to the charging unit 110 when the corresponding switches are also included in the charging unit 110. For example, in one embodiment the start signal is generally applied to switch $S_3$ (and optionally switch $S_2$) and the stop signal is generally applied to switch $S_1$, as shown in FIG. 4. If the start and stop signals are applied to the charging unit 110 instead of the measurement unit 120, it will be appreciated that the switches controlled by the start and stop signals will also be part of the charging unit 110 in such a way as to make the same type of connections shown in FIGS. 5 and/or 7.

It will be appreciated that at least the variable capacitors and the charge current $I_{chg}$ may be calibrated to provide the desired timer performance. In one embodiment, at least one of the variable capacitors and the charge current $I_{chg}$ may be calibrated responsive to a calibration instruction independently from, e.g., before or after, any time estimation operations. In another embodiment, at least one of the variable capacitors and the charge current $I_{chg}$ may be continuously calibrated while the charge-to-digital timer 100 simultaneously estimates the elapsed time. U.S. patent application Ser. No. 13/338,550 titled "Calibration of Charge-to-Digital Timer," which is filed concurrently herewith, discloses exemplary calibration techniques applicable to the charge-to-digital timer 100 disclosed herein.

The solution disclosed herein provides saves power and chip area relative to a conventional solution. For example, a conventional TDC may consume large peak currents due to the large number of inverters working at a high speed. With the CDT solution disclosed herein, the current during conversion is mainly due to the charging current, which is well controlled, and which helps with the power regulation required for the timer operation. Tests indicate that the power consumption and area of the CDT disclosed herein may be halved relative to conventional CDTs. Further, optimization of the quantization step of the CDT solution disclosed herein is easier than for a conventional VDL-based TDC because the parameters that define the resolution are well controlled and have negligible dependency on the mismatch between components. The current drawn by the conventional TDC changes rapidly during the actual conversion, and if the power supply is not capable of providing the fast changing current, the voltage ripple seen in the power supply will affect the conversion result. Further, increasing the maximum estimation time and keeping the same quantization noise level requires inserting more delays in a Vernier delay line, and thus increases the current consumption and area. With the CDT solution disclosed herein, this is not the case. Thus, the CDT solution disclosed herein provides several advantages over conventional TDC solutions.

Figure 9:
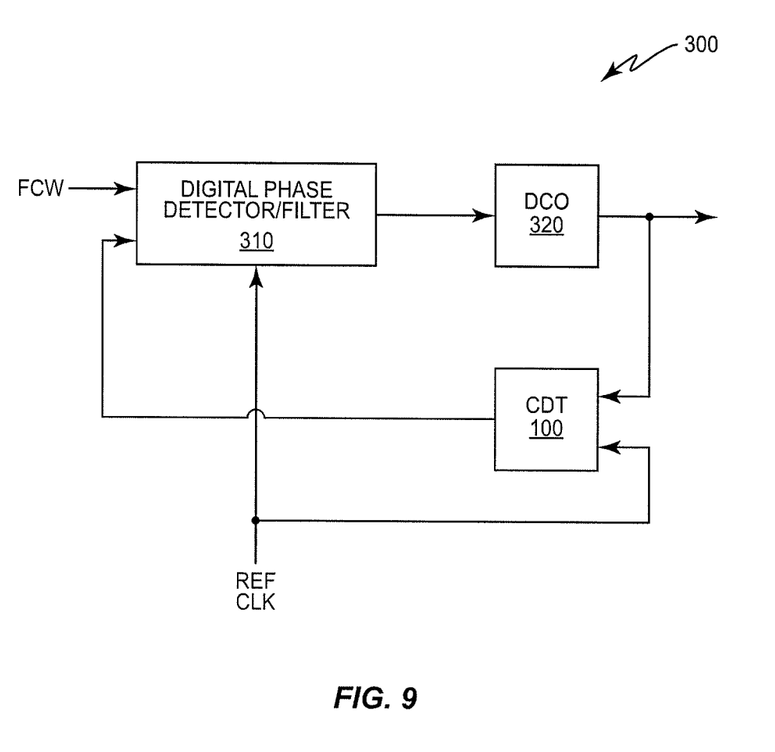
FIG. 9 depicts a block diagram of an exemplary phase-locked loop including the CDT disclosed herein.

The CDT solution disclosed herein may be used for any number of timing based electronic devices. For example, the CDT solution disclosed herein may be used to improve the performance of a digital phase-locked loop (DPLL). FIG. 9 shows a block diagram of one exemplary DPLL 300 comprising a digital phase detector/filter 310, a digitally controlled oscillator (DCO) 320, and the CDT 100 disclosed herein. CDT 100 determines the time difference between start and stop signals, as previously described herein, to quantize the phase of the signal output by the DCO. Digital detector 310 determines a phase error between the input frequency control word (FCW) and quantized phase provided by the CDT 100, where the output phase error controls the DCO 320 to generate an output signal at a desired frequency. It will be appreciated that the CDT 100 disclosed herein includes easily tunable parameters that facilitate the ability to tune the accuracy of the quantized phase provided by the CDT 100 over the required DCO output frequency range. Such improved quantization accuracy improves the overall operation of the DPLL relative to conventional solutions.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of estimating the elapsed time between a start signal and a stop signal, the method comprising:
charging a capacitive load with a known current between the start and stop signals to generate an initial value of a load voltage based on the charged capacitive load;
generating a reference voltage;
ramping one of the load voltage and the reference voltage, in a plurality of discrete voltage steps after the stop signal, until a comparison between the load and reference voltages satisfies a predetermined criterion;
when the comparison satisfies the predetermined criterion, estimating the initial load voltage based on the reference voltage and a combination of the discrete voltage steps; and
estimating the elapsed time between the start and stop signals based on the estimated initial load voltage, the charged capacitive load, and the known current.

2. The method of claim 1 wherein:
the reference voltage has an initial predetermined value greater than the initial value of the load voltage;
ramping one of the load voltage and the reference voltage comprises increasing the load voltage in the plurality of discrete voltage steps until the increasing load voltage equals or exceeds the reference voltage; and
estimating the initial load voltage comprises estimating the initial load voltage based on a negative combination of the discrete voltage steps and the initial value of the reference voltage.

3. The method of claim 1 wherein:
the reference voltage has an initial predetermined less than the initial value of the load voltage;
ramping one of the load voltage and the reference voltage comprises decreasing the load voltage in the plurality of discrete voltage steps until the decreasing load voltage is less than or equal to the initial value of the reference voltage; and
estimating the initial load voltage comprises estimating the initial based on a positive combination of the discrete voltage steps and the initial value of the reference voltage.

4. The method of claim 1 wherein:
the reference voltage has an initial predetermined value less than the initial value of the load voltage;
ramping one of the load voltage and the reference voltage comprises increasing the reference voltage in the plurality of discrete voltage steps until the increasing reference voltage equals or exceeds the load voltage; and
estimating the initial load voltage comprises estimating the initial load voltage based on a positive combination of the discrete voltage steps and the initial value of the reference voltage.

5. The method of claim 4 wherein the initial value of the reference voltage is zero.

6. The method of claim 1 wherein:
the reference voltage has an initial predetermined value greater than the initial load voltage;
ramping one of the load voltage and the reference voltage comprises decreasing the reference voltage in the plurality of discrete voltage increase steps until the decreasing reference voltage is less than or equal to the initial value of the load voltage; and
estimating the initial load voltage comprises estimating the initial load voltage based on a negative combination of the discrete voltage steps and the initial value of the reference voltage.

7. The method of claim 1 further comprising calibrating at least one of the charged capacitive load and the known current.

8. The method of claim 7 wherein calibrating at least one of the charged capacitive load and the known current comprises calibrating, responsive to a calibration instruction, at least one of the charged capacitive load and the known current independently from estimating the elapsed time.

9. The method of claim 7 wherein calibrating at least one of the charged capacitive load and the known current comprises continuously calibrating at least one of the charged capacitive load and the known current while simultaneously estimating the elapsed time.

10. A charge-to-digital timer operative to estimate the elapsed time between a start signal and a stop signal, comprising:
a charging unit operative to charge a capacitive load with a known current between the start and stop signals to generate a load voltage to generate a charged capacitive load;
a voltage stepping unit operatively connected to the charging unit and configured to ramp a first voltage from an initial value in a plurality of discrete voltage steps after the stop signal;
a comparator operatively connected to the charging unit and the voltage stepping unit and configured to compare the ramping first voltage to a second voltage;
an estimation unit operatively connected to the voltage stepping unit and the comparator, and configured to:
estimate the load voltage based on a combination of the discrete voltage steps when the ramping first voltage satisfies a predetermined condition relative to the second voltage; and
estimate the elapsed time between the start and stop signals from the estimated load voltage, the charged capacitive load, and the known current.

11. The timer of claim 10 wherein:
the initial value of the first voltage comprises the load voltage after the stop signal;
the second voltage comprises a predetermined reference voltage greater than the initial value of the first voltage;
the voltage stepping unit is configured to ramp the first voltage by increasing the first voltage from the initial value in the plurality of discrete voltage steps; and
the estimation unit is configured to estimate the load voltage based on a negative combination of the discrete voltage steps and the second voltage when the first voltage equals or exceeds the second voltage.

12. The timer of claim 10 wherein:
the initial value of the first voltage comprises the load voltage after the stop signal;
the second voltage comprises a predetermined reference voltage less than the initial value of the first voltage;
the voltage stepping unit is configured to ramp the first voltage by decreasing the first voltage from the initial value in the plurality of discrete voltage steps; and
the estimation unit is configured to estimate the load voltage based on a positive combination of the discrete voltage steps and the reference voltage when the first voltage is less than or equal to the second voltage.

13. The timer of claim 10 wherein:
the second voltage comprises the load voltage after the stop signal;

the initial value of the first voltage comprises a predetermined reference voltage less than the load voltage;
the voltage stepping unit is configured to ramp the first voltage by increasing the first voltage from the predetermined reference voltage in the plurality of discrete voltage steps; and
the estimation unit is operative to estimate the load voltage based on a positive combination of the discrete voltage steps and the first voltage when the first voltage equals or exceeds the second voltage.

14. The timer of claim 13 wherein the initial value of the first voltage is zero.

15. The timer of claim 10 wherein:
the second voltage comprises the load voltage after the stop signal;
the initial value of the first voltage comprises a predetermined reference voltage greater than the load voltage;
the voltage stepping unit is configured to ramp the first voltage by decreasing the first voltage from the predetermined reference voltage in the plurality of discrete voltage steps; and
the estimation unit is operative to estimate the load voltage based on a negative combination of the discrete voltage steps and the first voltage when the first voltage is less than or equal to the second voltage.

16. The timer of claim 10 wherein the capacitive load couples to an output of the charging unit and an input of the comparator and the capacitive load is configured to charge during a charge phase bound by the start and stop signals and to provide the load voltage to the input of the comparator during a measurement phase beginning after the stop signal.

17. The timer of claim 16 wherein the voltage stepping unit comprises a plurality of serially connected buffers coupled to a plurality of known capacitances, each buffer configured to delay a reference clock by a predetermined delay, wherein the voltage stepping unit ramps the first voltage responsive to the delayed reference clock sequentially output by the buffers.

18. The timer of claim 17 wherein the voltage stepping unit comprises:
a scale capacitor operatively connected at a first node to the output of the charging unit and the input of the comparator;
a gain capacitor connected between a second node of the scale capacitor and ground; and
wherein the plurality of ramp capacitors are each connected between the second node of the scale capacitor and an output of a corresponding one of the buffers, wherein the delayed reference clock applied by one of the buffers to the corresponding ramp capacitor ramps the first voltage by an amount stored in the corresponding ramp capacitor;
wherein the charged capacitive load is defined by at least one of the scale capacitor, the gain capacitor, a parasitic capacitance modeled as being connected between the input of the comparator and ground, and the plurality of ramp capacitors.

19. The timer of claim 18 wherein the voltage stepping unit further comprises:
a first switch connected between the output of the charging unit and the first node of the scale capacitor;
a second switch connected in parallel with the gain capacitor; and
a third switch connected in parallel with the parasitic capacitance;
wherein said second and third switches are maintained in an open position during the charge phase and the measurement phase, and said first switch is actuated to a closed position during the charge phase and maintained in an open position during the measurement phase.

20. The timer of claim 19 wherein the charge-to-digital timer enters a discharge phase to discharge the charged capacitive load after the ramping first voltage satisfies the predetermined condition relative to the second voltage or the estimation unit estimates the load voltage responsive to the comparator output, and wherein during the discharge phase, the first switch is maintained in the open position while the second and third switches are actuated to a closed position.

21. The timer of claim 17 wherein the voltage stepping unit comprises:
a gain capacitor connected between a second input of the comparator and ground;
a charge capacitor connected at a first node between a power source and the input of the comparator;
a step capacitor unit connected between the second input of the comparator and an input to a first one of the plurality of serially connected buffers connected to the reference clock; and
a plurality of ramp capacitors, each connected between another input of the comparator and an output of a corresponding one of the buffers, wherein the delayed reference clock applied by one of the buffers to the corresponding ramp capacitor ramps the first voltage by an amount stored in the corresponding ramp capacitor;
wherein the charged capacitive load is defined by the charge capacitor, and wherein the charging unit is operative to charge the charge capacitor during the charge phase.

22. The timer of claim 21 wherein the voltage stepping unit further comprises:
a first switch connected between the output of the charging unit and the first node of the charge capacitor;
a second switch connected in parallel with the gain capacitor; and
a third switch connected in parallel with the charge capacitor;
wherein said second and third switches are maintained in an open position during the charge phase and the measurement phase, and said first switch is actuated to a closed position during the charge phase and maintained in an open position during the measurement phase.

23. The timer of claim 22 wherein the charge-to-digital timer enters a discharge phase to discharge the gain capacitor, the charge capacitor, the step capacitor, and the plurality of ramp capacitors responsive to the comparator output, and wherein during the discharge phase, the first switch is maintained in the open position while the second and third switches are actuated to a closed position.

24. The timer of claim 21 further comprising a calibration unit configured to calibrate at least one of the charge capacitor, the gain capacitor, and the known current.

25. The timer of claim 24 wherein the calibration unit calibrates at least one of the charge capacitor, the gain capacitor, and the known current independently from estimating the elapsed time responsive to a calibration instruction.

26. The timer of claim 24 wherein the calibration unit is configured to continuously calibrate at least one of the charge capacitor, the gain capacitor, and the known current while simultaneously estimating the elapsed time.

27. A phase-locked loop comprising:
a charge-to-digital timer configured to quantize a phase of an input digitally controlled oscillator (DCO) signal;
a digital phase detector configured to detect a phase error responsive to the quantized phase of the DCO signal; and a digitally controlled oscillator configured to generate the DCO signal at a desired frequency responsive to the phase error output by the digital phase detector;

wherein the charge-to-digital timer is configured to determine the quantized phase based on an estimation of an elapsed time between a start signal and a stop signal, said charge-to-digital timer comprising:

a charging unit operative to charge a capacitive load with a known current between the start and stop signals to generate a load voltage to generate a charged capacitive load;

a voltage stepping unit operatively connected to the charging unit and configured to ramp a first voltage from an initial value in a plurality of discrete voltage steps after the stop signal;

a comparator operatively connected to the charging unit and the voltage stepping unit and configured to compare the ramping first voltage to a second voltage;

an estimation unit operatively connected to the voltage stepping unit and the comparator, and configured to:
  estimate the load voltage based on a combination of the discrete voltage steps when the ramping first voltage satisfies a predetermined condition relative to the second voltage; and
  estimate the elapsed time between the start and stop signals from the estimated load voltage, the charged capacitive load, and the known current.

* * * * *